United States Patent
Miao et al.

(10) Patent No.: US 10,347,563 B2
(45) Date of Patent: *Jul. 9, 2019

(54) BARRIER STRUCTURES BETWEEN EXTERNAL ELECTRICAL CONNECTORS

(71) Applicant: Taiwan Semiconductor Manufacturing Company, Ltd., Hsinchu (TW)

(72) Inventors: Chia-Chun Miao, Taichung (TW); Kai-Chiang Wu, Hsinchu (TW); Shih-Wei Liang, Daijia Township (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 15/601,702

(22) Filed: May 22, 2017

(65) Prior Publication Data
US 2017/0256477 A1 Sep. 7, 2017

Related U.S. Application Data

(63) Continuation of application No. 14/147,338, filed on Jan. 3, 2014, now Pat. No. 9,698,079.

(51) Int. Cl.
*H01L 23/48* (2006.01)
*H01L 23/00* (2006.01)
(Continued)

(52) U.S. Cl.
CPC ............ *H01L 23/481* (2013.01); *H01L 24/04* (2013.01); *H01L 24/07* (2013.01); *H01L 24/10* (2013.01); *H01L 24/11* (2013.01); *H01L 23/3114* (2013.01); *H01L 23/3192* (2013.01); *H01L 23/525* (2013.01); *H01L 24/03* (2013.01);
(Continued)

(58) Field of Classification Search
CPC ................................ H01L 24/02; H01L 24/17
See application file for complete search history.

(56) References Cited

U.S. PATENT DOCUMENTS

| 5,327,013 | A | 7/1994 | Moore et al. |
| 6,376,769 | B1 | 4/2002 | Chung |
| 6,569,753 | B1 | 5/2003 | Akram et al. |
| 6,841,883 | B1 | 1/2005 | Farnworth et al. |
| 8,508,043 | B2 * | 8/2013 | Daubenspeck et al. ..................... H01L 31/00 257/737 |

(Continued)

FOREIGN PATENT DOCUMENTS

WO 2013074178 A1 5/2013

Primary Examiner — Phat X Cao
(74) Attorney, Agent, or Firm — Slater Matsil, LLP

(57) ABSTRACT

A structure includes a die substrate; a passivation layer on the die substrate; first and second interconnect structures on the passivation layer; and a barrier on the passivation layer, at least one of the first or second interconnect structures, or a combination thereof. The first and second interconnect structures comprise first and second via portions through the passivation layer to first and second conductive features of the die substrate, respectively. The first and second interconnect structures further comprise first and second pads, respectively, and first and second transition elements on a surface of the passivation layer between the first and second via portion and the first and second pad, respectively. The barrier is disposed between the first pad and the second pad. The barrier does not fully encircle at least one of the first pad or the second pad.

20 Claims, 5 Drawing Sheets

(51) Int. Cl.
  *H01L 23/31* (2006.01)
  *H01L 23/525* (2006.01)

(52) U.S. Cl.
  CPC .............. *H01L 24/05* (2013.01); *H01L 24/13* (2013.01); *H01L 24/16* (2013.01); *H01L 24/81* (2013.01); *H01L 2224/0235* (2013.01); *H01L 2224/02245* (2013.01); *H01L 2224/02375* (2013.01); *H01L 2224/0401* (2013.01); *H01L 2224/05569* (2013.01); *H01L 2224/05624* (2013.01); *H01L 2224/11013* (2013.01); *H01L 2224/11916* (2013.01); *H01L 2224/13111* (2013.01); *H01L 2224/16225* (2013.01); *H01L 2224/81191* (2013.01); *H01L 2924/00011* (2013.01); *H01L 2924/013* (2013.01); *H01L 2924/01322* (2013.01)

(56) References Cited

U.S. PATENT DOCUMENTS

| | | | |
|---|---|---|---|
| 9,698,079 B2 * | 7/2017 | Miao | H01L 23/481 |
| 2005/0017343 A1 | 1/2005 | Kwon et al. | |
| 2006/0088951 A1 | 4/2006 | Hayashi et al. | |
| 2006/0211171 A1 | 9/2006 | Tummala et al. | |
| 2010/0044882 A1 * | 2/2010 | Park | H01L 21/563 |
| | | | 257/778 |
| 2011/0068437 A1 * | 3/2011 | Chiu | H01L 21/76898 |
| | | | 257/621 |
| 2011/0156264 A1 | 6/2011 | Machida | |
| 2012/0228013 A1 | 9/2012 | Matienzo et al. | |
| 2012/0319251 A1 * | 12/2012 | Yu | H01L 24/05 |
| | | | 257/632 |
| 2013/0187277 A1 | 7/2013 | Chen et al. | |
| 2013/0249101 A1 | 9/2013 | Lin et al. | |

* cited by examiner

BARRIER STRUCTURES BETWEEN EXTERNAL ELECTRICAL CONNECTORS

PRIORITY CLAIM AND CROSS-REFERENCE

This patent application is a continuation of U.S. application Ser. No. 14/147,338, filed on Jan. 3, 2014, which application is hereby incorporated by reference herein as if reproduced in its entirety.

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various material layers using lithography to form circuit components and elements thereon. Dozens or hundreds of integrated circuits are typically manufactured on a single semiconductor wafer. The individual dies are singulated by sawing the integrated circuits along a scribe line. The individual dies are then packaged separately, in multi-chip modules, or in other types of packaging, for example.

The semiconductor industry continues to improve the integration density of various electronic components (e.g., transistors, diodes, resistors, capacitors, etc.) by continual reductions in minimum feature size, which allow more components to be integrated into a given area. These smaller electronic components such as integrated circuit dies may also require smaller packages that utilize less area than packages of the past, in some applications.

One type of smaller packages for semiconductor devices that has been developed is a Wafer Level Package (WLP), in which integrated circuits are packaged in packages that typically include a redistribution layer (RDL) or Post-Passivation Interconnect (PPI) that is used to fan-out or fan-in wiring for contact pads of the package, so that electrical contacts can be made on a larger or smaller pitch than contact pads of the integrated circuit. WLPs are often used to package integrated circuits (ICs) demanding high speed, high density, and greater pin count, as examples.

BRIEF DESCRIPTION OF THE DRAWINGS

For a more complete understanding of the present embodiments, and the advantages thereof, reference is now made to the following descriptions taken in conjunction with the accompanying drawings, in which.

DETAILED DESCRIPTION OF ILLUSTRATIVE EMBODIMENTS

The making and using of the present embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosed subject matter, and do not limit the scope of the different embodiments.

Embodiments will be described with respect to a specific context, namely barriers formed in relation to Post-Passivation Interconnect (PPI) structures and electrical connectors formed on the PPI structures, such as used in Wafer Level Chip-Scale Packaging (WLCSP). Other embodiments may also be applied, however, to other applications and/or packages where external electrical connectors may be used. Like reference numbers used throughout the figures refer to like components. Although method embodiments may be discussed as being performed in a particular order, other method embodiments may be performed in any logical order.

Figure 1:
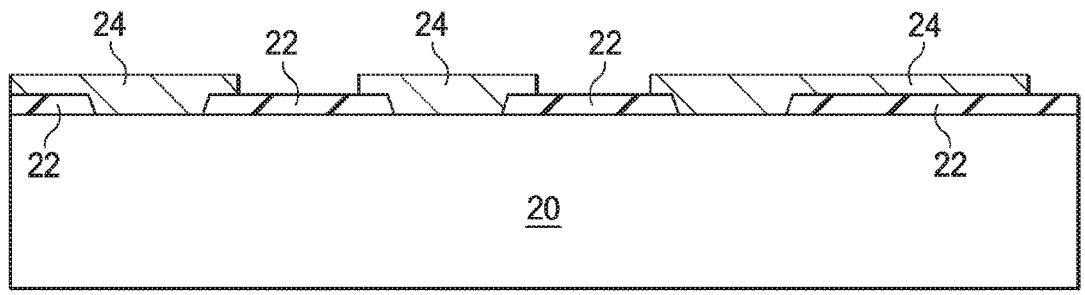
FIG. 1 is a die substrate having a passivation layer and Post-Passivation Interconnect (PPI) structures comprising PPI pads according to an embodiment.
Figure 6:
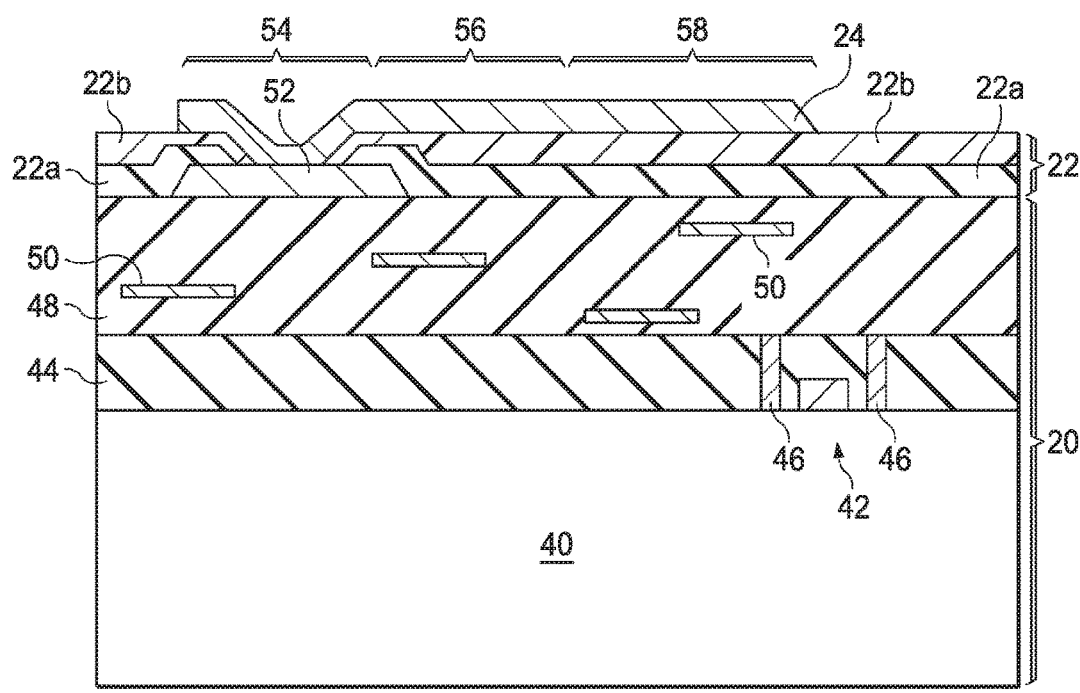
FIG. 6 is detail view of a portion of the die substrate in FIG. 1 according to an embodiment.

FIG. 1 illustrates a die substrate 20 having a passivation layer 22 and PPI structures 24 comprising PPI pads. FIG. 6 illustrates a portion of FIG. 1 in more detail. Referring to FIG. 6, a portion of a substrate 40 having electrical circuitry formed thereon is shown in accordance with an embodiment. The substrate 40 may comprise, for example, bulk silicon, doped or undoped, or an active layer of a semiconductor-on-insulator (SOI) substrate. Generally, an SOI substrate comprises a layer of a semiconductor material, such as silicon, formed on an insulator layer. The insulator layer may be, for example, a buried oxide (BOX) layer or a silicon oxide layer. The insulator layer is provided on a substrate, typically a silicon or glass substrate. Other substrates, such as a multi-layered or gradient substrate, may also be used.

Electrical circuitry formed on the substrate 40 may be any type of circuitry suitable for a particular application. In an embodiment, the electrical circuitry includes electrical devices formed on the substrate 40 with one or more dielectric layers overlying the electrical devices. Metal layers may be formed in or between dielectric layers to route electrical signals between the electrical devices. Electrical devices may also be formed in one or more dielectric layers.

For example, a device 42 may include various devices, such as transistors, like a N-type field effect transistor (NFET) and/or P-type field effect transistor (PFET); capacitors; resistors; diodes; photo-diodes; fuses; and the like; interconnected to perform one or more functions. The functions may include memory structures, processing structures, sensors, amplifiers, power distribution, input/output circuitry, or the like. One of ordinary skill in the art will appreciate that the above examples are provided for illustrative purposes to further explain applications of some illustrative embodiments. Other circuitry may be used as appropriate for a given application.

Also shown in FIG. 6 is an inter-layer dielectric (ILD) layer 44. The ILD layer 44 may be formed, for example, of a low-K dielectric material, such as phosphosilicate glass (PSG), borophosphosilicate glass (BPSG), fluorinated silicate glass (FSG), $SiO_xC_y$, Spin-On-Glass, Spin-On-Polymers, silicon carbon material, compounds thereof, composites thereof, combinations thereof, or the like, by any suitable method known in the art, such as spinning, chemical vapor deposition (CVD), and plasma-enhanced CVD (PECVD). It should also be noted that the ILD layer 44 may comprise a plurality of dielectric layers.

Contacts, such as contacts 46, are formed through the ILD layer 44 to provide electrical contacts to devices, such as device 42. The contacts 46 may be formed, for example, by using photolithography techniques to deposit and pattern a photoresist material on the ILD layer 44 to expose portions of the ILD layer 44 that are to become the contacts 46. An etch process, such as an anisotropic dry etch process, may be used to create openings in the ILD layer 44. The openings may be lined with a diffusion barrier layer and/or an adhesion layer (not shown), and filled with a conductive material. In an embodiment, the diffusion barrier layer comprises one or more layers of TaN, Ta, TiN, Ti, CoW, or the like, and the conductive material comprises copper, tungsten, aluminum, silver, and combinations thereof, or the like, thereby forming the contacts 46 as illustrated in FIG. 6.

One or more inter-metal dielectric (IMD) layers 48 and the associated metallization layers 50 are formed over the ILD layer 44. Generally, the one or more IMD layers 48 and the associated metallization layers 50 are used to interconnect devices 42 to each other and/or to provide an interconnection for external electrical connection. The IMD layers 48 may be formed of a low-K dielectric material, such as FSG formed by PECVD techniques or high-density plasma CVD (HDPCVD), or the like.

It should be noted that one or more etch stop layers (not shown) may be positioned between adjacent ones of the dielectric layers, e.g., the ILD layer 44 and the IMD layers 48. Generally, the etch stop layers provide a mechanism to stop an etching process when forming vias and/or contacts. The etch stop layers are formed of a dielectric material having a different etch selectivity from adjacent layers, e.g., the underlying semiconductor substrate 40, the overlying ILD layer 44, and the overlying IMD layers 48. In an embodiment, etch stop layers may be formed of SiN, SiCN, SiCO, CN, combinations thereof, or the like, deposited by CVD or PECVD techniques.

A pad 52 is provided on the uppermost IMD layer to provide external electrical connections to devices and the electrical circuitry. In an embodiment, the pad 52 is an aluminum pad or an aluminum-copper pad, although other materials may be used. The pad 52 may be formed using a plating process, such as electroless plating, electro-plating, or the like.

A passivation layer 22a is formed over the IMD layers 48 and may be formed of a dielectric material, such as SiN, a plasma-enhance oxide (PEOX), a plasma-enhanced SiN (PE-SiN), plasma-enhanced undoped silicate glass (PE-USG), or the like. The passivation layer 22a is formed such that at least a portion of the pad 52 is exposed. The passivation layer 22a may be formed by a blanket deposition and patterned using photolithography and etching processes to provide an opening over the pad 52 and to protect the underlying layers from various environmental contaminants.

FIG. 6 further illustrates a polymer layer 22b formed over passivation layer 22a. Polymer layer 22b may be formed of a polymer such as an epoxy, polyimide, benzocyclobutene (BCB), polybenzoxazole (PBO), and the like. The formation methods may include spin coating, for example. The polymer layer 22b is patterned to form an opening, through which the pad 52 is exposed. The patterning of polymer layer 22b may include photolithography techniques. A curing step may be performed to cure the polymer layer 22b.

A PPI structure 24 is formed and patterned over the polymer layer 22b and fills an opening in a polymer layer 22b and a passivation layer 22a, thereby forming an electrical connection with the pad 52. The PPI structure 24 provides an electrical connection upon which an electrical connector, e.g., a solder ball/bump, may be placed. In an embodiment, the PPI structure 24 is formed of copper or copper alloy formed by a plating process, such as electro-less plating, electroplating, or the like. In other embodiments, the PPI structure 24 may be a multi-layered structure, such as a copper layer coated with electro-less nickel electro-less palladium immersion gold (ENEPIG), which includes a nickel layer, a palladium layer on the nickel layer, and a gold layer on the palladium layer. The gold layer may be formed using immersion plating. In other embodiments, other conductive materials may be used to form the PPI structure 24.

Figure 7:
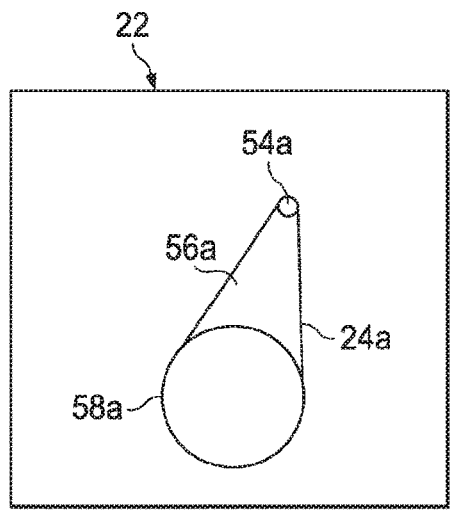
FIGS. 7 through 9 are layout views of example PPI structures according to embodiments.
Figure 8:
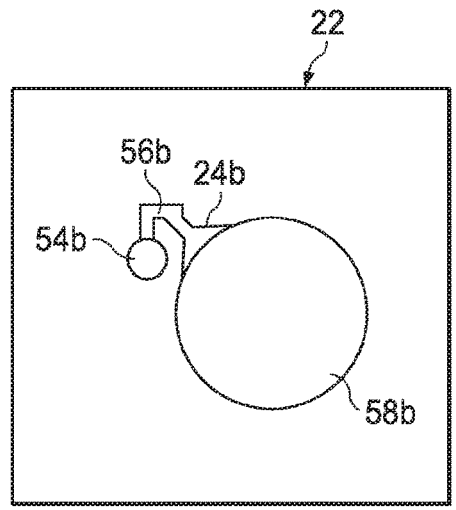
Figure 9:
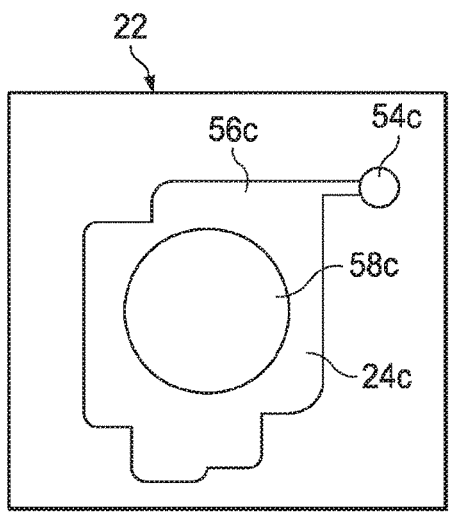

The PPI structure 24 includes a PPI via portion 54, a PPI pad 58, and a PPI transition element 56 interposed between the PPI via portion 54 and the PPI pad 58. FIGS. 7 through 9 show example PPI structures 24a, 24b, and 24c respectively. In FIG. 7, the PPI structure 24a comprises a PPI transition element 56a that expands continuously from the PPI via portion 54a to the PPI pad 58a. In FIG. 8, the PPI structure 24b comprises a PPI transition element 56b that extends from the PPI via portion 54b as a line and bends before expanding continuously to the PPI pad 58b. In FIG. 9, the PPI structure 24c is a wide PPI metal design and comprises a PPI transition element 56c that extends from the PPI via portion 54c to a wide area on which is the PPI pad 58c.

Figure 2:
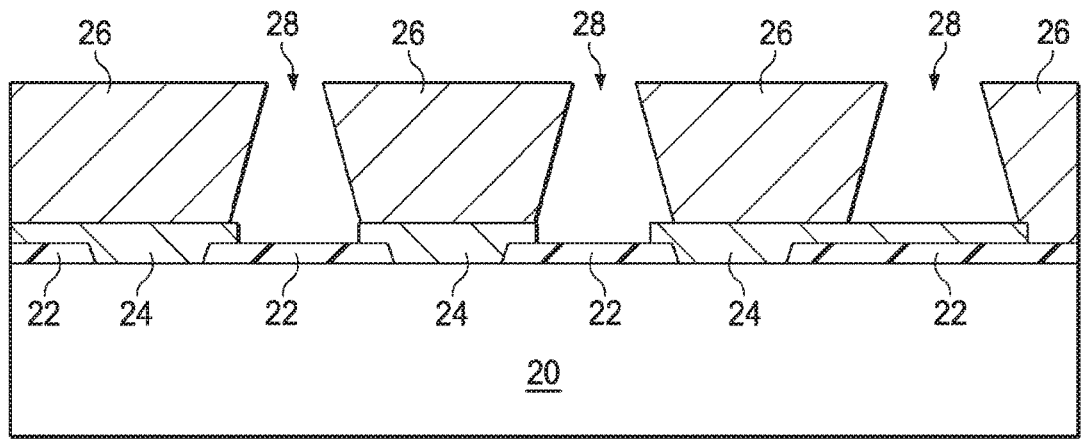
FIG. 2 is a stencil placed over the passivation layer and the PPI structures according to an embodiment.

Referring back to FIG. 2, a stencil 26 is placed over the passivation layer 22 and the PPI structures 24. The stencil 26 is a solid or rigid material such as a metal, glass, or the like. The stencil 26 has openings 28 that expose portions of the passivation layer 22 and/or the PPI structures 24. The openings 28 may define barriers 30 subsequently formed (see following figures) and may define various different patterns of such barriers 30, examples of which will be discussed below with reference to FIGS. 10 through 14. The openings 28 are generally located between respective adjacent PPI pads 58 of the PPI structures 24, and the stencil 26 generally covers at least the PPI pads 58 of the PPI structures 24. In an embodiment, the stencil 26 has a thickness between about 50 μm and about 250 μm. The thickness of the stencil 26 may be varied according to a particular application. By determining a particular thickness of the stencil 26, the height of the subsequently formed barriers 30 may be defined by that thickness of the stencil 26. By controlling the height of the barriers 30, such as increasing the height, an electrical connector 32, such as a solder ball, can have its height controlled, such as by increasing its height, which may result in increased reliability.

Figure 3:
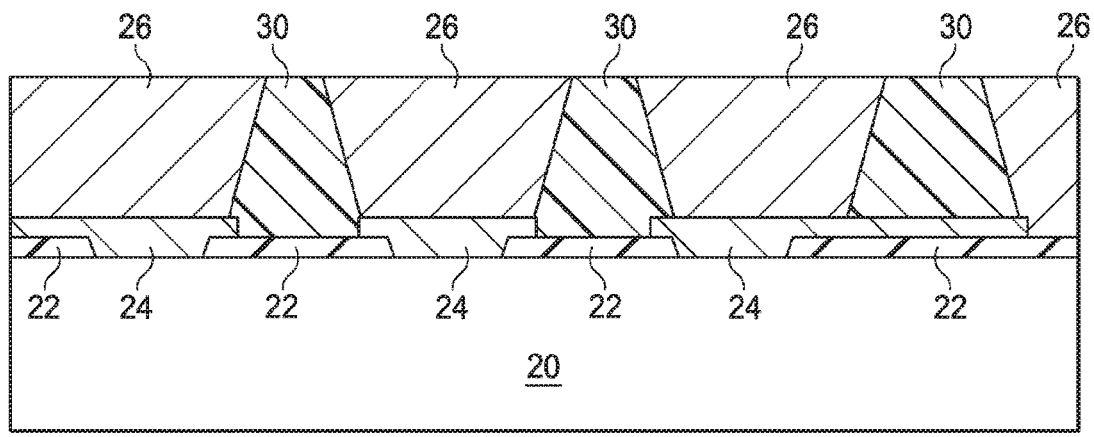
FIG. 3 is barriers formed in openings of the stencil according to an embodiment.

In FIG. 3, barriers 30 are formed in the openings 28 of the stencil 26. The barriers 30 may be formed by using a printing process, a spin on process, a coating process, the like, or a combination thereof. The barriers 30 may comprise a polymer material, such as a molding compound, such as a powder or gel epoxy, resin, polymer, polyimide, polybenzoxazole (PBO), benzocyclobutene (BCB), silicone, an acrylate, the like, or a combination thereof. In an example, a liquid molding compound material is used, and is formed in the openings 28 of the stencil 26. A blade, squeegee, or other sweeping apparatus may be moved over the upper surfaces of the stencil 26 to force the material of the barriers 30, such as a liquid molding compound, through the openings 28 in the stencil 26 and/or to remove excess material from the stencil 26. A curing process may be used to harden, e.g., the liquid molding compound and contract the molding compound. By curing and contracting, the molding compound may be released from and not adhere to the stencil 26.

Figure 4:
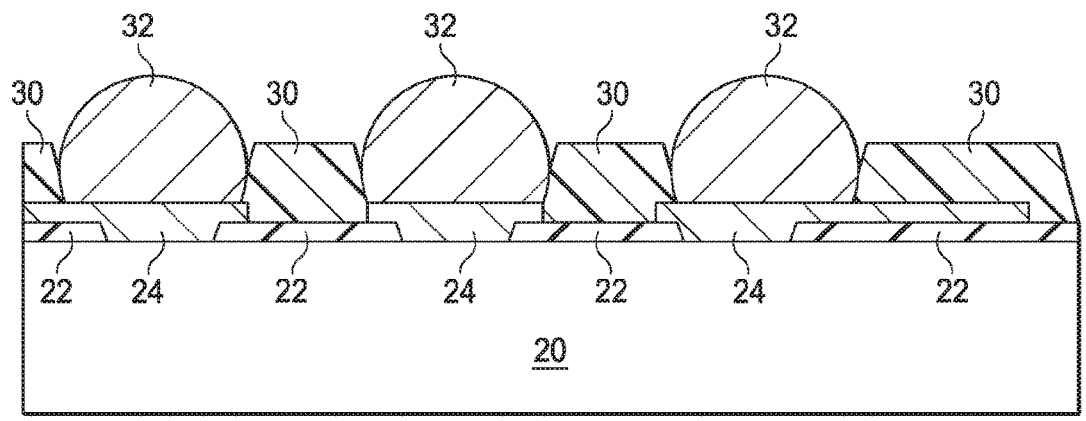
FIG. 4 is the release and removal of the stencil from the die substrate, and the formation of electrical connectors according to an embodiment.

In FIG. 4, the stencil 26 is released and removed from the die substrate 20, and electrical connectors 32 are formed on the PPI pads 58 of the PPI structures 24 and between the barriers 30. The electrical connectors 32 may comprise a eutectic material and may comprise a solder bump or a solder ball, as examples. The solder includes both lead-based and lead-free solders, such as Pb—Sn compositions for lead-based solder; lead-free solders including InSb; tin, silver, and copper ("SAC") compositions; and other eutectic materials that have a common melting point and form conductive solder connections in electrical applications. For lead-free solder, SAC solders of varying compositions may be used, such as SAC 105 (Sn 98.5%, Ag 1.0%, Cu 0.5%), SAC 305, and SAC 405, as examples. Lead-free conductive materials such as solder balls may be formed from SnCu compounds as well, without the use of silver (Ag). Lead-free solder connectors may include tin and silver, Sn-Ag, without the use of copper. The electrical connectors 32 may be one among an array of the electrical connectors 32 formed as a grid, referred to as a "ball grid array" or "BGA". The electrical connectors 32 may be arranged in other patterns. The electrical connectors 32 comprise a conductive ball having a shape of a partial sphere in some embodiments. In other embodiments, the electrical connectors 32 may comprise other shapes. The electrical connectors 32 may also comprise non-spherical conductive connectors, for example. The electrical connectors 32 are attached in some embodiments using a solder ball drop process. During the electrical connectors 32 mounting process, or after the electrical connectors 32 mounting process, the eutectic material of the electrical connectors 32 may be re-flowed.

Figure 5:
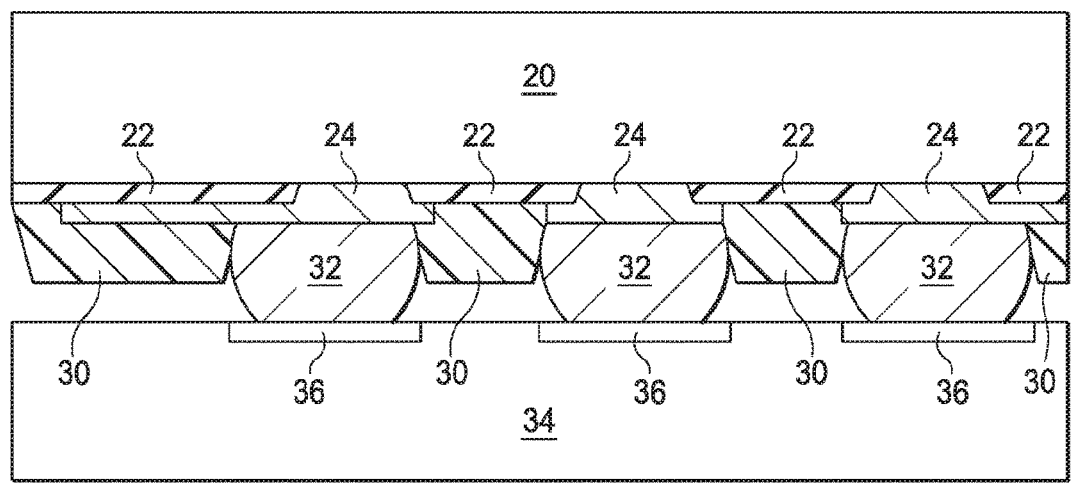
FIG. 5 is the die substrate attached to a packaging substrate using the electrical connectors according to an embodiment.

In FIG. 5, the die substrate 20 is attached to a packaging substrate 34 using the electrical connectors 32. The packaging substrate 34 may comprise a ceramic, plastic, and/or organic material, as examples, although the packaging substrate 34 may comprise other materials. The packaging substrate 34 further comprises bond pads 36 to which the electrical connectors 32 are bonded. The electrical connectors 32 may be reflowed to attach the die substrate 20 to the packaging substrate 34. The barriers 30 may adjoin a surface of the packaging substrate 34 in some embodiments. By doing so, the barriers 30 may aid in controlling a height of the electrical connectors 32, and by having a larger height of the electrical connectors 32, a greater reliability of the electrical connectors 32 may be achieved.

Figure 10:
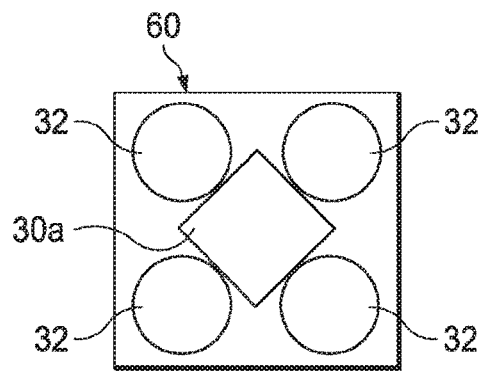
FIGS. 10 through 14 are layout views of example patterns for barriers according to embodiments.
Figure 11:
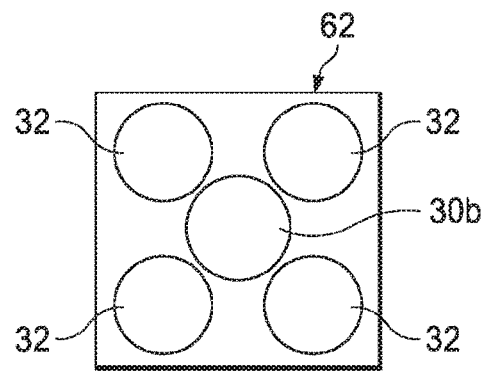
Figure 12:
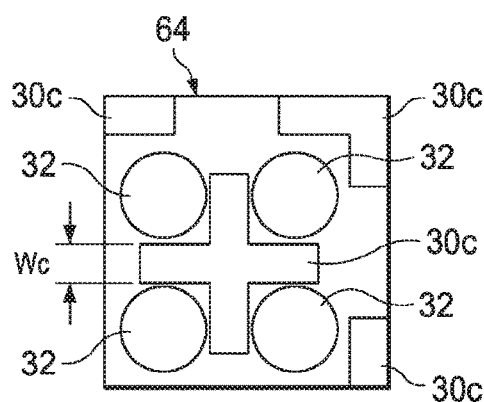
Figure 13:
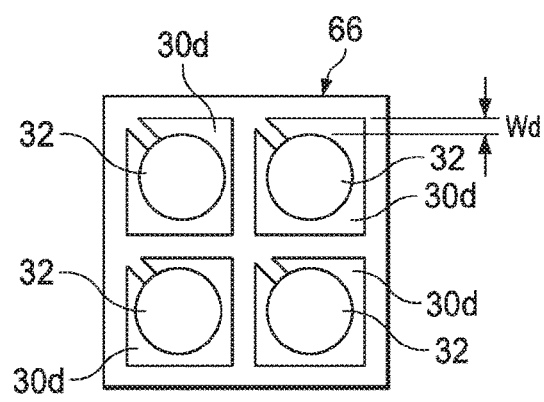
Figure 14:
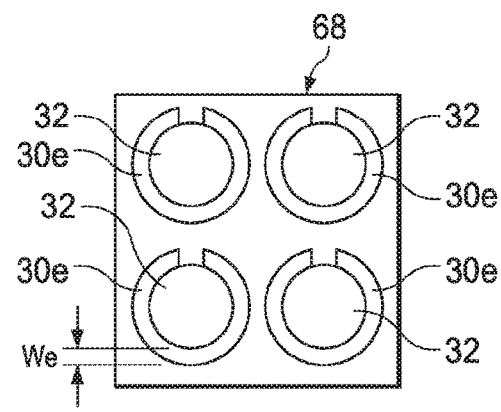

FIGS. 10 through 14 are layout views of example patterns 60, 62, 64, 66, and 68 for barriers 30. The patterns 60, 62, 64, 66, and 68 may be reproducible and repeatable across a die substrate surface, and may be combined with any of the illustrated patterns or other patterns on the die substrate surface. The barriers 30a, 30b, 30c, 30d, and 30e may have a thickness, e.g., in a direction perpendicular to a surface on which the electrical connectors 32 are formed, between about 50 µm and about 250 µm, such as discussed above. In FIG. 10, the pattern 60 includes a square barrier 30a between four adjacent electrical connectors 32, where the vertices of the square barrier 30a are disposed between respective adjacent pairs of electrical connectors 32 that are not adjacent along a diagonal axis of the four adjacent electrical connectors 32. The square barrier 30a may have a lateral edge that is between about 50 µm and about 300 µm. In FIG. 11, the pattern 62 includes a circular barrier 30b between four adjacent electrical connectors 32. The circular barrier 30b may have a diameter that is between about 50 µm and about 300 µm. In FIG. 12, the pattern 64 includes a cross-shaped barrier 30c, with extending portions of the cross-shaped barrier 30c being between respective adjacent pairs of electrical connectors 32 that are not adjacent along a diagonal axis of the four adjacent electrical connectors 32. Portions of other cross-shaped barriers 30c are illustrated for the purposes of indicating the repeatable pattern across a die substrate surface. The cross-shaped barrier 30c may have a lateral width We of a branch that is between about 50 µm and about 300 µm. In FIG. 13, the pattern 66 includes individual square-shaped barriers 30d around individual electrical connectors 32. The square-shaped barriers 30d may have a thinnest lateral width Wd that is between about 50 µm and about 150 µm. In FIG. 14, the pattern 68 includes individual ring-shaped barriers 30e around individual electrical connectors 32. The ring-shaped barriers 30e may have a lateral width We that is between about 50 µm and about 150 µm. In some embodiments, the square-shaped barriers 30d and ring-shaped barriers 30e, as well as other barriers, may substantially encircle, e.g., not fully encircle, the electrical connectors 32 since a tongue or connecting portion of the stencil 26 may be needed to connect a portion of the stencil 26 over the PPI pad 58 for the electrical connector 32. It should be noted that barriers 30a, 30b, and 30c, as illustrated, also do not fully encircle the electrical connectors 32.

Embodiments may achieve advantages. First, by having barriers 30, electrical connectors 32 may be more easily aligned with PPI pads 58, which may increase a reliability, both electrically and mechanically, between the electrical connectors 32 and the PPI pads 58. Further, the barriers 30 may help prevent bridging of adjacent electrical connectors 32, such as during a reflow process. Embodiments may be particularly advantageously applied to wide metal designs for PPI structures, which may prevent ball shifting. Also, embodiments may have reduced warpage during thermal cycling because there may be less cumulative expansion of a material between the die substrate 20 and the package substrate 34. For example, the barriers 30 may expand locally during thermal cycling, rather than causing an expansion throughout a uniform material.

An embodiment is a structure comprising a die substrate; a passivation layer on the die substrate; first and second interconnect structures on the passivation layer; and a barrier on the passivation layer, at least one of the first interconnect structure or the second interconnect structure, or a combination thereof. A distal surface of the passivation layer is away from the die substrate. The first interconnect structure comprises a first via portion through the passivation layer to a first conductive feature of the die substrate. The first interconnect structure further comprises a first pad and a first transition element on the distal surface of the passivation layer between the first via portion and the first pad. The second interconnect structure comprises a second via portion through the passivation layer to a second conductive feature of the die substrate. The second interconnect structure further comprises a second pad and a second transition element on the distal surface of the passivation layer between the second via portion and the second pad. The barrier is disposed between the first pad and the second pad. The barrier does not fully encircle at least one of the first pad or the second pad.

Another embodiment is a structure comprising a die substrate having a passivation layer thereover; a plurality of post-passivation interconnect (PPI) structures at least partially over the passivation layer; and a plurality of barriers over the passivation layer. Each of the PPI structures comprises a pad over the passivation layer. Each of the barriers is discrete from others of the barriers, and each of the barriers is disposed between at least a respective adjacent pair of the pads of the PPI structures.

A further embodiment is a method comprising forming barriers on a side of a die substrate, the side of the die substrate comprising post-passivation interconnect (PPI) structures, the PPI structures comprising respective pads, each of the barriers being between a neighboring pair of the pads, each of the barriers being discreet from others of the barriers; and after forming the barriers, forming electrical connectors on the pads.

In accordance with an embodiment, a structure includes a substrate; a passivation layer on the substrate; a first interconnect structure on and extending through the passivation layer; a second interconnect structure on and extending through the passivation layer; and a barrier disposed between the first interconnect structure and the second interconnect structure. The barrier being in direct contact with a surface of the passivation layer opposite the substrate, and the barrier directly contacts the first interconnect structure.

In accordance with an embodiment, a structure includes a substrate; a passivation layer over the substrate; a first conductive pad and a second conductive pad over the passivation layer; and a barrier disposed between the first conductive pad and the second conductive pad. The first conductive pad is disposed partially disposed between the barrier and the passivation layer along a line perpendicular to a major surface of the substrate, and the passivation layer forms an interface with the barrier.

In accordance with an embodiment, a method includes forming passivation layer over a substrate; forming a first contact pad and a second contact pad over the passivation layer; placing a stencil over the passivation layer, wherein an opening in the stencil exposes a portion of the passivation layer disposed between the first contact pad and the second contact pad; and depositing a non-conductive material in the opening to form a barrier. The non-conductive material is deposited in direct contact with the passivation layer. The method further includes removing the stencil and after removing the stencil, forming a first electrical connector on the first contact pad and a second electrical connector on the second contact pad.

Although the present embodiments and their advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A structure comprising:
a substrate;
a passivation layer on the substrate;
a first interconnect structure on and extending through the passivation layer;
a second interconnect structure on and extending through the passivation layer;
a third interconnect structure on and extending through the passivation layer;
a fourth interconnect structure on and extending through the passivation layer; and
a first barrier disposed between the first interconnect structure and the second interconnect structure, a bottom surface of the first barrier being in direct contact with an upper surface of the passivation layer opposite the substrate, the first barrier directly contacting the first interconnect structure, the first barrier directly contacting the second interconnect structure; and
a second barrier disposed between the third interconnect structure and the fourth interconnect structure, a bottom surface of the second barrier being in direct contact with the upper surface of the passivation layer opposite the substrate, the first barrier being discontinuous from the second barrier.

2. The structure of claim 1 further comprising:
a first solder region directly contacting the first interconnect structure; and
a second solder region directly contacting the second interconnect structure, the first barrier being disposed between the first solder region and the second solder region.

3. The structure of claim 2, wherein the first barrier has a same shape as the first solder region in a top-down view.

4. The structure of claim 2, wherein the first barrier has a different shape than the first solder region in a top-down view.

5. The structure of claim 2 further comprising:
a third solder region directly contacting the third interconnect structure, the first barrier being disposed between the first solder region and the third solder region.

6. The structure of claim 2, wherein the first barrier at least partially encircles the first solder region in a top-down view.

7. The structure of claim 1, wherein the first interconnect structure extends between the first barrier and the passivation layer along direction perpendicular to a major surface of the substrate.

8. The structure of claim 1, wherein the first barrier comprises an insulating material.

9. The structure of claim 1, wherein a height of the first barrier in a direction perpendicular to a major surface of the substrate is between 50 µm and 250 µm.

10. The structure of claim 2, further comprising:
a packaging substrate attached to the first solder region and the second solder region, wherein a top of the first barrier and a top of the second barrier adjoin the packaging substrate.

11. A structure comprising:
a substrate;
a passivation layer over the substrate;
a first conductive pad and a second conductive pad over the passivation layer; and
a barrier disposed between the first conductive pad and the second conductive pad, wherein the first conductive pad is at least partially disposed between the barrier and the passivation layer along a line perpendicular to a major surface of the substrate, wherein the passivation layer forms an interface with the barrier, wherein a gap in the barrier extends from a top surface of the barrier toward the substrate, and wherein as a result of the gap the barrier only partially encircles the first conductive pad in a plan view.

12. The structure of claim 11, wherein the interface between the passivation layer and the barrier is substantially parallel to the major surface of the substrate.

13. The structure of claim 11, further comprising:
a first solder region on the first conductive pad; and
a second solder region on the second conductive pad, wherein the first solder region and the second solder region bonds the substrate to a package substrate, and wherein the barrier is disposed between the first solder region and the second solder region along a line parallel to the major surface of the substrate.

14. The structure of claim 11, wherein the barrier comprises a circular-shape, a rectangular shape, or a cross-shape in a top-down view.

15. A method comprising:
forming a passivation layer over a substrate;
forming a first contact pad and a second contact pad over the passivation layer;
placing a stencil over the passivation layer, wherein an opening in the stencil exposes a portion of the passivation layer disposed between the first contact pad and the second contact pad; and
depositing a non-conductive material in the opening to form a barrier, wherein the non-conductive material is deposited in direct contact with the passivation layer;
removing the stencil; and
after removing the stencil, forming a first electrical connector on the first contact pad and a second electrical connector on the second contact pad.

16. The method of claim 15, wherein the first electrical connector comprises a first solder region, and wherein the second electrical connector comprises a second solder region.

17. The method of claim 15 further comprising curing the non-conductive material.

18. The method of claim 17, wherein curing the non-conductive material releases the non-conductive material from the stencil.

19. The method of claim 15 further comprising defining a height of the stencil in accordance with a height of the first electrical connector.

20. The method of claim 15, wherein the first electrical connector and the second electrical connector extend farther from the passivation layer than the non-conductive material.

* * * * *